(12) United States Patent
Bimberg et al.

(10) Patent No.: US 9,979,158 B1
(45) Date of Patent: May 22, 2018

(54) VERTICAL-CAVITY SURFACE-EMITTING LASER

(71) Applicant: Technische Universitaet Berlin, Berlin (DE)

(72) Inventors: Dieter Bimberg, Berlin (DE); Gunter Larisch, Neuenhagen (DE); James A. Lott, Berlin (DE)

(73) Assignee: Technische Universitaet Berlin, Berlin (DE)

( * ) Notice: Subject to any disclaimer, the term of this patent is extended or adjusted under 35 U.S.C. 154(b) by 0 days. days.

(21) Appl. No.: 15/404,786

(22) Filed: Jan. 12, 2017

(51) Int. Cl.
*H01S 5/183* (2006.01)

(52) U.S. Cl.
CPC ...... *H01S 5/18341* (2013.01); *H01S 5/18361* (2013.01)

(58) Field of Classification Search
CPC .......... H01S 5/18341; H01S 5/18361
See application file for complete search history.

(56) References Cited

U.S. PATENT DOCUMENTS

| | | | | |
|---|---|---|---|---|
| 6,144,682 A * | 11/2000 | Sun | ..................... | H01S 5/18394 372/45.01 |
| 2004/0191941 A1* | 9/2004 | Morgan | .............. | H01S 5/18308 438/27 |

OTHER PUBLICATIONS

P. Wolf et al., "High-Speed and Temperature-Stable oxide-confined 980-nm VCSELs for Optical Interconnects," IEEE Journal of Selected Topics in Quantum Electronics, vol. 9, pp. 1-7, 2013.
A. Mutig et al, "Highly temperature-stable modulation characteristics of multioxide-aperture highspeed 980 nm vertical cavity surface emitting lasers", American Institue of Physics, Applied Physics Letters, vol. 97, 151101-1; 2010.
D. Ellafi et al., "Control of cavity lifetime of 1.5 um wafer-fused VCSELs by digital mirror trimming", Optics Express, vol. 22, No. 26, Dec. 29, 2014.
P. Westbergh et al, "Impact of Photon Lifetime on High-Speed VCSEL Performance", IEEE Journal of Selected Topics in Quantum Electronics, vol. 17, pp. 1603-1613, Nov.-Dec. 2011.
M. Köhler et al. "Etching in Microsystem Technology". Weinheim [etc.]: Wiley-VCH, 1999.
Gregory C. Desalvo et al, "Wet Chemical Digital Etching of GaAs at Room Temperature", Wright State University, Core Scholar; Physics Faculty Publications; vol. 143, Jan. 1, 1996.
A. Larsson, "Advances in VCSELs for Communication and Sensing", IEEE Journal of Selected Topics in Quantum Electronics, vol. 17, No. 6, pp. 1552-1567, Nov./Dec. 2011.
L. A. Coldren et al. "Diode Lasers and Photonic Integrated Circuits" A Wiley-Interscience Publication, John Wiley & Sons, Inc. , New York, NY, USA: Wiley, 1995.
G. Larisch et al. "Impact of Photon Lifetime on the Temperature Stability of 50 Gb/s 980 nm VCSELs", IEEE Photonics Technology Letters, vol. 28, No. 21, pp. 2327-2330, Nov. 1, 2016.
G. Larisch et al. "Correlation of photon lifetime and maximum bit rate for 55 Gbitls energy-efficient 980 nm VCSELs", IEEE Optical Interconnects Conference, pp. 16-17, 2016.

* cited by examiner

*Primary Examiner* — Dung Nguyen
(74) *Attorney, Agent, or Firm* — Gordson Rees Scully Mansukhani, LLP

(57) ABSTRACT

A vertical cavity surface emitting laser comprising a first reflector, a second reflector comprising a layer stack of semiconductor or isolating layers, an active region arranged between the first and second reflectors, and an additional layer on top of the layer stack at the light output side, said additional layer forming an output interface of the laser, wherein the refractive index of the additional layer is smaller, equal to or larger than the smallest refractive index of the refractive indices of said layer stack.

18 Claims, 7 Drawing Sheets

VERTICAL-CAVITY SURFACE-EMITTING LASER

BACKGROUND OF THE INVENTION

Fundamental goals of research and development in the field of optical data communication are energy-efficiency and error-free data transmission across maximum distances at largest bit rates. For conventional data transmission systems based on multiple-mode optical fiber lengths of less than 2 km, as for supercomputers or between servers of data centers, high modulation bandwidth VCSELs are indispensable. In order to optimize the VCSEL bandwidth, the differential gain ($\partial g/\partial N$) is maximized $\partial g/\partial N$ is maximized, the active volume $V_g$ is minimized (for example by reducing the optical cavity length to $\lambda/2$), and large pump currents are achieved by minimizing the resistance and the thermal conductivity [1, 2]. An additional degree-of-freedom, that has been largely overlooked until now, is the optimization of the cavity photon lifetime, essentially controlled by mirror reflectivity. Here we describe a low cost method to adjust the mirror reflectivity to optimize the cavity photon lifetime.

Previous approaches to adjust the cavity photon lifetime used dry etching of the top mirror surface [3, 4]. Very low etching rates and very shallow depths as well as an extremely precise control of the etching progress and the homogeneity across the surface are necessary for this purpose. However, the etching rate during dry etching is not constant in time. As an alternative, several wet chemical etching procedures have been investigated.

A frequently used wet chemical solution exposed GaAs layers to a mixture of an acid (usually sulfuric acid $H_2SO_4$, phosphoric acid $H_3PO_4$, or citric acid $C_6H_8O_7$) and hydrogen peroxide ($H_2O_2$), along with purified water ($H_2O$) to dilute the solution and thus reduce the etch rate. It is also possible to use hydrochloric acid (HCl) along with nitric acid ($HNO_3$), as the oxidizer. Hydrogen peroxide or nitric acid have the task of oxidizing the semiconductor surface. The oxides are etched away by the acids. Depending on the concentration of the solution, a desired etching rate can be achieved. However, the etching rate changes very sensitively with the concentration and the temperature of the solution, with its pH value (potential or power of hydrogen) and with its movements. Typically the etch rates are time dependent and nonuniform across the surface, unless a large volume of the solution is continuously mixed, to achieve a constant value at the etched surface [5]. Wet etching is also negatively impacted by the surface features of the VCSEL, such as the top metal ring contact and by any surface defects, thus generally resulting in unsatisfactory results being not well suited for high volume manufacturing.

A particularly precise control of the etch depth is claimed by the use of digital etching [6]. Here, oxidation and the etching of the oxides are separated from each other by two alternating repeatable steps. The surface is oxidized with hydrogen peroxide without the presence of an acid. This process is limited by diffusion and results in a precise oxide thickness on the GaAs surface for VCSELs using GaAs-based top mirrors, or any other surface for other types of VCSELs. For a very broad time window (for example between 5 s and 120 s) of exposure to the hydrogen peroxide an oxidation depth limited to about 15 nm is achieved [6]. The oxide is then removed by the acid in the absence of the hydrogen peroxide. The acid removes the oxidized GaAs leaving a fresh GaAs surface which may then be again oxidized. The treatment with the acid must be strictly separated from the treatment with the hydrogen peroxide, such that the removal of oxidized layers of GaAs proceeds in steps. To ensure this, the structures are rinsed with ultrapure deionized water after each step and dried using a wafer spinner. The use of HCl can lead to problems with the metal contacts. The use of $C_6H_8O_7$ is believed to be more gentle compared to the other acids. The temperature of $H_2SO_4:H_2O_2:H_2O$ must be monitored since the initial mixture results in an exothermic reaction (temperature rise). This digital etching method has been reported to result in reliable etching depths. However, any surface roughness, surface defect, or geometric proximity effect renders this technique unreliable. The exposed GaAs mirror surface is strongly attacked, irrespective of the acid or etching solution used and the method of application. FIG. 1 as an example, shows this very clearly.

More specifically, FIG. 1 shows scanning electron micrographs of the GaAs mirror surface of completely processed VCSELs after digital wet etching using the technique described in [6]. Within the top metal ring contact, the GaAs is pitted, the etching is nonuniform, and surface defects lead to serious cracking. Additionally, residual photoresist results in obvious unwanted features near the inner edges of the metal rings.

The digital technique is unstable and not suitable for volume production.

Altering the cavity photon lifetime by wet or dry etching is thus at least complex and/or uncontrollable, typically resulting in unintended destruction of the VCSEL surface leading to reliability problems.

The invention as described hereinafter proposes a simple and nondestructive method to address the problems discussed above.

OBJECTIVE OF THE PRESENT INVENTION

An objective of the present invention is to provide a vertical cavity surface emitting laser with an improved performance compared to prior art devices.

A further objective of the present invention is to provide a method for fabricating a vertical cavity surface emitting laser that exhibits an improved performance compared to prior art devices.

BRIEF SUMMARY OF THE INVENTION

An exemplary embodiment of the invention relates to a vertical cavity surface emitting laser comprising
  a first reflector,
  a second reflector comprising a layer stack of semiconductor or isolating layers,
  an active region arranged between the first and second reflectors, and
  an additional layer on top of the layer stack at the light output side, said additional layer forming an output interface of the laser,
  wherein the refractive index of the additional layer is smaller than the smallest refractive index of the refractive indices of said layer stack.

Depending on the design parameters, the exemplary embodiment may show improved laser characteristics, in particular with respect to the small-signal modulation bandwidth, the energy consumption for data transmission at a given bit rate, and/or the achievable laser diode output power.

The embodiment as described above may have, but does not need to have, one or more of the following features, which are considered to further improve the laser's performance, but are not mandatory:

The transmission of the additional layer at the emission wavelength of the laser is preferably larger than 99%.

According to a preferred embodiment, the thickness of the additional layer is chosen such that a design parameter $H(f_r)$ is in the range between 2.5 and 3.2 dB, wherein the design parameter $H(f_r)$ is determined by applying a voltage that generates a predetermined bias current and a small sinusoidal current signal through the laser, sweeping the frequency of the sinusoidal signal in a given frequency range, measuring the small signal response of the radiation that leaves the laser at the output interface, fitting the measured small signal response to the following transmission function H(f):

$$H(f) = A \cdot \frac{f_R^2}{\left(f_R^2 \cdot f^2 + i\frac{\gamma}{2\pi}f\right)} \cdot \frac{1}{1+i\frac{f}{f_P}}$$

and determining the parameters $f_R$, $\gamma$, A and $f_P$, wherein $f_R$ describes the relaxation resonance frequency, $\gamma$ the damping parameter, A an offset and $f_P$ the 3 dB frequency of the laser's parasitics, and calculating the design parameter $H(f_R)$ by calculating the value of the transmission function H(f) at the relaxation resonance frequency $f_R$ based on the parameters that were determined as explained above.

An electrical contact is preferably arranged on at least one section of a highly doped layer of said layer stack. The doping concentration of said highly doped layer preferably exceeds $5 \cdot 10^{18}$ cm$^{-3}$.

The additional layer may partly cover the electrical contact.

The additional layer may be an isolating layer (e.g. a dielectric layer) or a conductive layer.

Preferably, the additional layer is a silicon nitride layer, a silicon oxide layer, a titanium oxide layer, an indium tin oxide layer or a GaAs layer.

The thickness of the additional layer is preferably between (0.02*λ and 0.24*λ)+n*0.5*λ or between (0.26*λ and 0.48*λ)+n*0.5*λ, where n is an integer. In other words, the thickness d of the additional layer preferably lies in one of the following ranges:

0.02*λ+n*0.5*λ≤d≤0.24*λ+n*0.5*λ or 0.26*λ+n*0.5*λ≤d≤0.48*λ+n*0.5*λ.

λ is the wavelength of the emitted radiation in the given material.

A further exemplary embodiment of the invention relates to a method of fabricating a vertical cavity surface emitting laser, the method comprising the steps of fabricating a first reflector, fabricating an active region on top of the first reflector, fabricating a second reflector on top of the active region, the second reflector comprising a layer stack of semiconductor layers or isolating layers, and depositing an additional layer on top of the layer stack, wherein the refractive index of the additional layer is smaller than the smallest refractive index of the refractive indices of said layer stack.

The method as described above may comprise, but does not need to comprise, one or more of the following features which are considered to further improve the laser's performance, but are not mandatory:

The step of depositing the additional layer is preferably completed when a design parameter $H(f_R)$ is in the range between 2.5 and 3.2 dB wherein the design parameter $H(f_R)$ is determined by applying a voltage that generates a predetermined bias current and a small sinusoidal current signal through the laser, sweeping the frequency of the sinusoidal signal in a given frequency range, measuring the small signal response of the radiation that leaves the laser at the output interface, fitting the measured small signal response to the following transmission function H(f):

$$H(f) = A \cdot \frac{f_R^2}{\left(f_R^2 \cdot f^2 + i\frac{\gamma}{2\pi}f\right)} \cdot \frac{1}{1+i\frac{f}{f_P}}$$

and determining the parameters $f_R$, $\gamma$, A and $f_P$, wherein $f_R$ describes a relaxation resonance frequency, $\gamma$ the damping parameter, A an offset and $f_P$ the 3 dB frequency of the laser's parasitics, and calculating the design parameter $H(f_R)$ by calculating the value of the transmission function H(f) at the relaxation resonance frequency $f_R$ based on the parameters that were determined in the previous step.

The laser is preferably fabricated by depositing the additional layer with a suitable layer thickness that provides a design parameter $H(f_R)$ in the range between 2.5 and 3.2 dB.

The suitable layer thickness may have been determined beforehand based on a plurality of lasers with varying thicknesses of the additional layer and therefore varying design parameters $H(f_R)$.

The deposition of the additional layer may also comprise one or more deposition steps, each deposition step comprising:

(a) depositing a thin layer of isolating or conducting material, (b) applying a voltage that generates a predetermined bias current and a small sinusoidal current signal through the laser structure, (c) sweeping the frequency of the sinusoidal signal in a given frequency range, (d) measuring the small signal response of the radiation that leaves the laser structure at the output interface, (e) fitting the measured small signal response to the following transmission function H(f):

$$H(f) = A \cdot \frac{f_R^2}{\left(f_R^2 \cdot f^2 + i\frac{\gamma}{2\pi}f\right)} \cdot \frac{1}{1+i\frac{f}{f_P}}$$

and determining the parameters $f_R$, $\gamma$, A and $f_P$, wherein $f_R$ describes the relaxation resonance frequency, $\gamma$ the damping parameter, A an offset and $f_P$ the 3 dB frequency of the laser's parasitics, and (f) calculating the design parameter $H(f_R)$ by calculating the value of the transmission function H(f) at the relaxation resonance frequency $f_R$, based on the parameters determined in step (e), (g) if the design parameter $H(f_R)$ is in the range between 2.5 and 3.2 dB, finishing the deposition of layer material, and (h) if the design parameter $H(f_R)$ is outside said range between 2.5 and 3.2 dB, repeating above steps (a)-(h).

Further, an electric contact layer may be deposited on a section of a highly doped layer of the second reflector. The doping concentration of said highly doped layer preferably exceeds $5*10^{18}$ cm$^{-3}$.

An isolating material is preferably deposited to planarize (flatten or level) the wafer surface.

The additional layer may be deposited after the deposition of the contact layer.

According to a preferred embodiment, the contact layer is deposited on a section of a highly doped layer of said layer stack. The additional layer is deposited after the deposition of the contact layer and said voltage that generates the predetermined bias current and the small sinusoidal current signal, is applied to the contact layer after the deposition of the additional layer.

The additional layer may be an isolating layer or a conductive layer. Preferably, the additional layer is a silicon nitride layer, a silicon oxide layer, a titanium oxide layer, an indium tin oxide layer or a GaAs layer.

BRIEF DESCRIPTION OF THE DRAWINGS

In order that the manner, in which the above-recited and other advantages of the invention are obtained, will be readily understood, a more particular description of the invention briefly described above will be rendered by reference to specific embodiments thereof, which are illustrated in the appended figures. Understanding that these figures depict only typical embodiments of the invention and are therefore not to be considered to be limiting of its scope, the invention will be described and explained with additional specificity and detail by the use of the accompanying drawings in which

FIG. 2a): A simulation that shows the change of power reflectivity by changing the out-coupling mirror. FIG. 2b): In parallel to the reflectance the cavity photon lifetime changes with the same change of the out-coupling mirror as in FIG. 2a. Please note the periodicity in thickness of both, the reflectivity and the cavity photon lifetime. FIG. 2c): Small signal responses for one VCSEL under the same driving conditions at two different cavity photon lifetimes. The lifetime decreases from the circles to the triangles.

as a function of the parameter $H(f_R)$, based on a calculation where VCSEL parasitics are neglected. The two vertical lines shows the range of $H(f_R)$, where the changes are largest.

Figure 5:
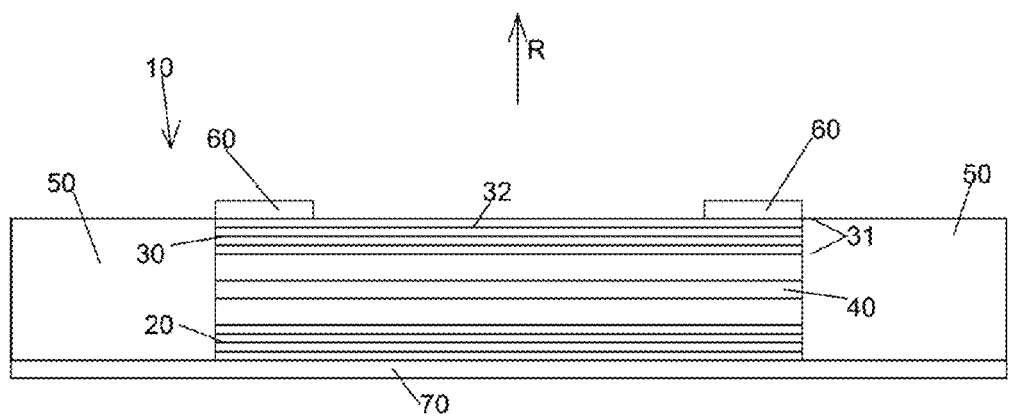

FIG. 5: shows a cross-section of a fully processed VCSEL before depositing an additional layer.

Figure 6:
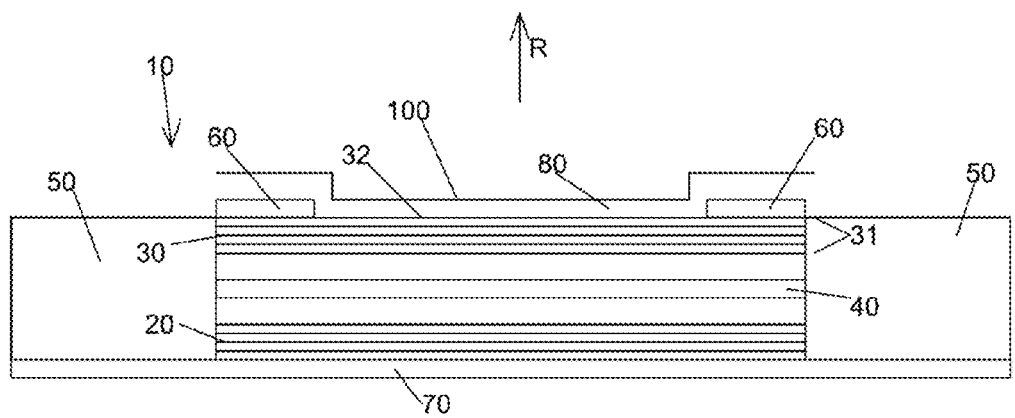

FIG. 6: shows a cross-section through of a fully processed VCSEL after depositing an additional layer.

Figure 7:
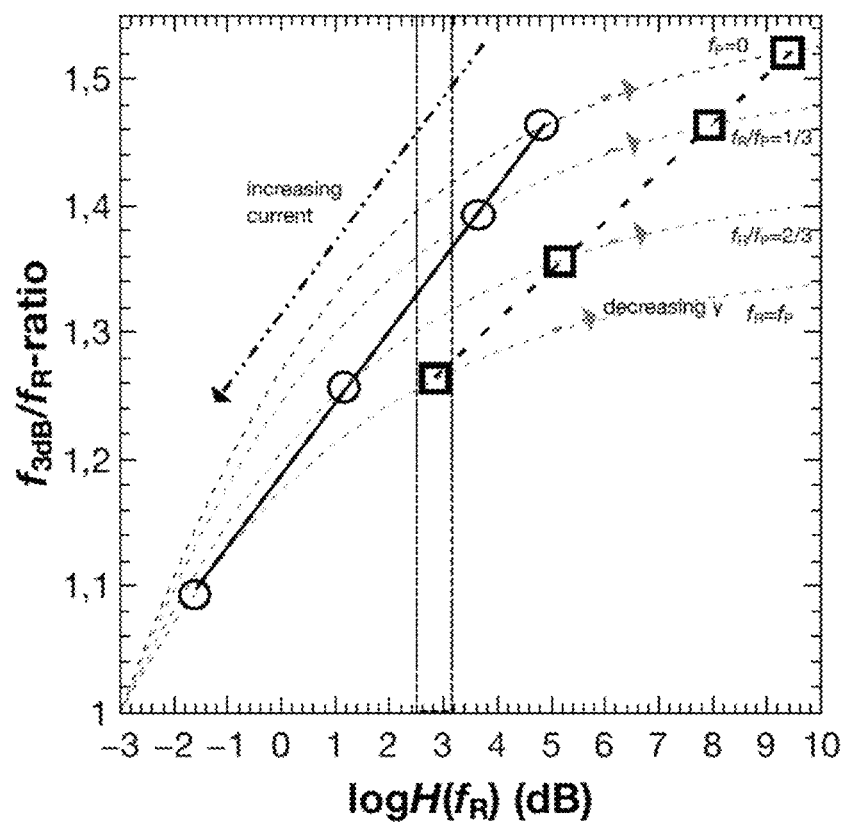

FIG. 7 shows the simulated ratio of bandwidth and relaxation resonance frequency as a function of log $H(f_R)$ for one VCSEL with two different mirror reflectivities (round/square symbols: larger/smaller reflectivity, respectively) for increasing current. The dashed and full straight lines connecting the symbols present the variation of $f_{3\ dB}/f_R$ for decreasing current (left to right) for smaller (dashed) and a larger (full) values of the damping parameter γ, respectively. Decreasing damping corresponds to a shift along the faintly dashed curves. The two vertical lines display the window for maximum bandwidth.

DETAILED DESCRIPTION OF THE PREFERRED EMBODIMENTS

The preferred embodiments of the present invention will be best understood by reference to the drawings, wherein identical or comparable parts are designated by the same reference signs throughout.

It will be readily understood that the parameters of the embodiments of the present invention, as generally described herein, could vary in a wide range. Thus, the following more detailed description of exemplary embodiments of the present invention, is not intended to limit the scope of the invention, but is merely representative of presently preferred embodiments of the invention.

Figure 1:
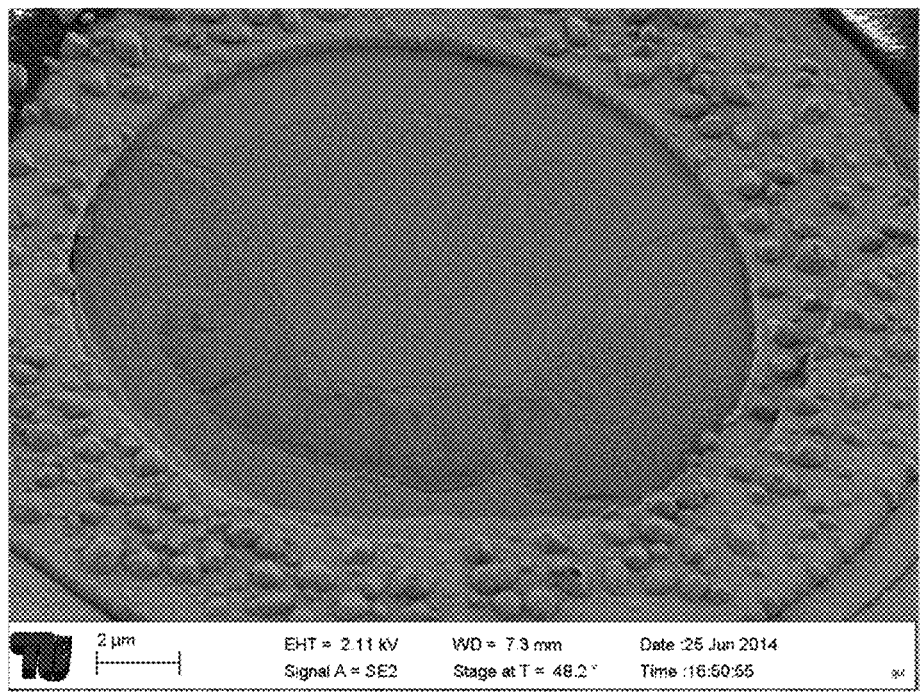
FIG. 1 shows scanning electron micrographs of a GaAs mirror surface of completely processed VCSELs after digital wet etching using the technique described in [6].
Figure 1:
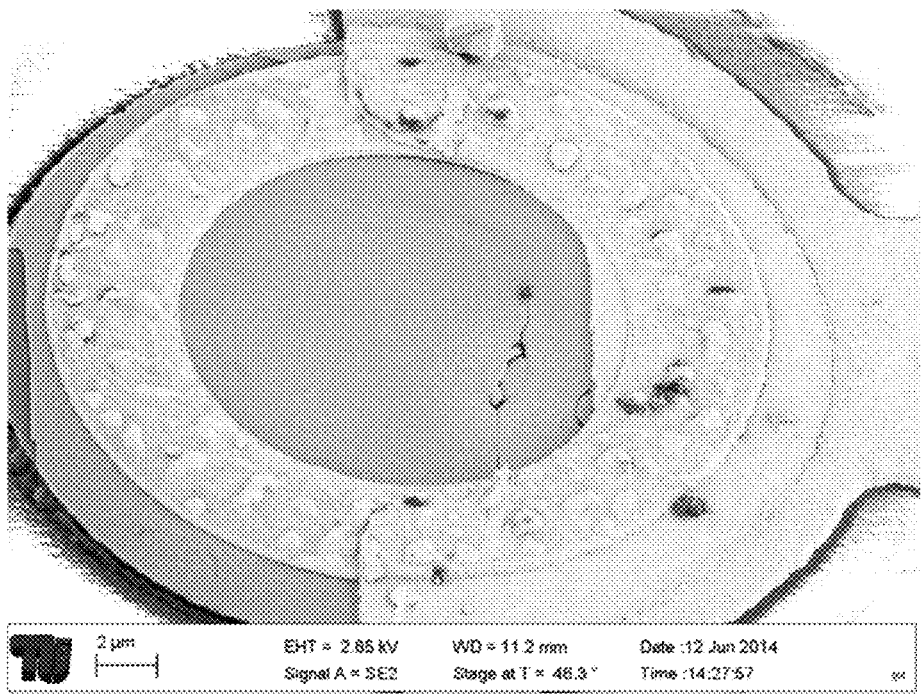

Instead of controlling the thickness of the top mirror (reflector) layer by subsequent reduction of the layer thickness by etching (as discussed above with respect to FIG. 1), exemplary embodiments of the present invention as described hereinafter propose the deposition of an additional layer (e.g. an isolating layer). Again, the following explanations are directed to exemplary embodiments only, and are not intended to limit the scope of the claimed invention.

The mirror reflectivity (see upper (second) reflector 30 in FIGS. 5 and 6) can be changed by adding an additional layer (see reference numeral 80 in FIGS. 5 and 6) onto the surface in a controlled manner. A variety of materials are available for this purpose, which are nonconducting or conducting, but transparent at the VCSEL emission wavelength. Such a material can be deposited by sputtering, electron beam evaporation, or plasma-enhanced chemical vapor deposition (PECVD) on the VCSEL surface simply and rapidly in a production environment. In addition hybrid layers of multiple materials can be deposited in the same manner.

In an electron beam (e-beam) evaporator, electrons are released by a heated cathode and accelerated toward a crucible at a voltage of several thousand volts. The material in the crucible is thereby evaporated and condenses on the surface of a sample placed next to the crucible. The deposition rate can be measured in situ via an oscillating quartz sensor. The deposition rate can be controlled via the heating current of the cathode. The advantages of this process are the in situ control and the large variety of materials that can be deposited. Sputtering is quite similar: A noble gas plasma evaporates material from a target, which condenses on the surface of a sample placed next to the target.

Plasma-enhanced chemical vapor deposition (PECVD) is a coating process in which the molecules of the processing gases are broken. Some of the resulting ions and radicals form a solid amorphous layer on the target. The cracking of the molecules is not caused by external heat, but by the accelerated electrons of the plasma.

The advantage of all methods is that materials can be deposited at relatively low temperatures on the surface of the VCSEL, thus avoiding damage to the VCSELs.

With e-beam, sputtering and PECVD, it is possible to produce high reflectance DBRs by depositing one or two materials of different refractive indices as an extension of the semiconductor DBR. With all three thin-film deposition methods, changes of the photon lifetime in VCSELs with top DBRs can be achieved.

The addition of a top layer allows to make a change in the cavity photon lifetime. A series of very thin identical isolating coatings has been tested. For practical reasons, the use of the above methods is favored, as these methods allow routine, rapid, and accurate deposition of thin layers. In general many different sorts of layers and deposition methods could be used.

For the investigation of the stepwise change of the cavity photon lifetime, layers are preferably deposited on VCSELs, which have already been completely processed.

BCB preferably used for VCSEL planarization cannot be heated to more than 200° C. because of damage. The PECVD process provides the possibility of coating with both silicon nitride and silicon dioxide at low (well below 200° C.) temperatures. A coating recipe for $Si_xN_y$ deposition at 100° C. may be implemented. For accurate layer thickness control, it is advantageous to carry out a test coating on a test wafer before the actual coating. From the test coating the resulting deposited thickness and index of refraction is determined by means of ellipsometry. It is most easy to coat a second dummy wafer in parallel with the actual sample. From this dummy wafer the layer thickness can be determined.

Since the PECVD coating is of the entire sample surface, the resulting isolating layer covers the top DBR but also the metal contact pads. The insulating layer on the contact pads should therefore be opened in window regions in order to perform on-wafer probe testing or later in order to place wirebonds for VCSEL packaging.

Separation of Contacts and Mirrors:

In a manner, similar to the patterning of the VCSEL surface with metal contacts and pads, a thin-film lift-off process can be used for parts of the topmost dielectric layer. For some coating materials, this lift-off method is independent of the deposited material and of the deposition technique employed. The solvents used to dissolve the photoresist may also attack the BCB used for VCSEL planarization. Therefore, the thickness of the deposited material is preferably significantly less than the thickness of the negative photoresist used for the lift-off process.

In order to protect the BCB in the case of the deposition of several coatings, the entire sample surface can be coated with an additional layer. In the following, it is assumed that the additional layer is an insulating layer, however, other materials can also be used as already pointed out above.

After the coating, only the additional material that is above the contact pads is removed by etching, employing a material-dependent etching recipe.

In order to determine the optimum cavity photon lifetime for a given VCSEL the impact of the cavity photon lifetime on the small-signal bandwidth is determined.

Optimization of Bandwidth and Energy Efficiency

In order to achieve the highest possible bandwidth $f_{3\,dB}$ for a vertical-cavity surface-emitting laser, by changing the reflectivity and reflectivity phase of the top mirror via the photon life $\tau_p$, a compromise between $\tau_p$, attenuation $\gamma$, and relaxation resonance frequency $f_R$ must be found [4]. A reduction of $\tau_p$ leads to a reduction of $\gamma$ and generally to an increase of $f_{3\,dB}$ by increasing the ratio $f_{3\,dB}/f_R$. At the same time, however, there is a reduction of $f_R$, that can have a negative influence on the bandwidth. Furthermore the threshold current and the optical power increase for decreasing reflectivity/photon lifetime/damping. A larger threshold current leads to an increase of energy consumption per bit. This increase can over-compensated by the increased bandwidth, which eventually might decrease the consumed energy per bit. A larger output power enables using smaller aperture diameters, leading to an additional decrease of consumed energy. The optimization presented here therefore enables increasing the bandwidth in concert with reduced energy consumption per bit and increased optical output power.

Figure 2:
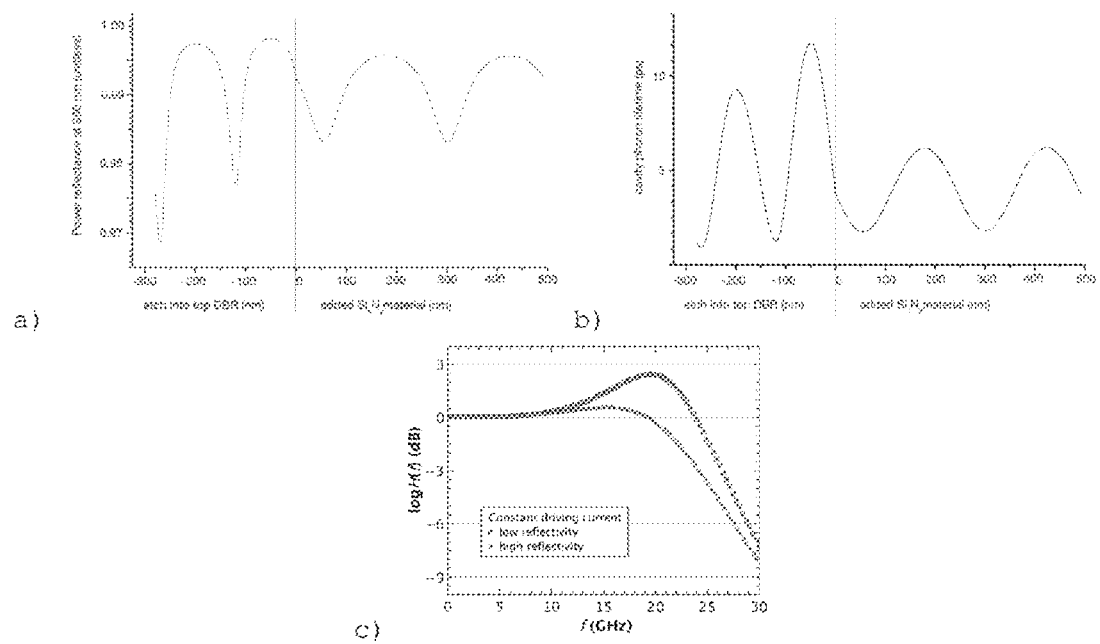
FIG. 2 shows how an added $Si_xN_y$ or an etched mirror surface influences the bandwidth of a laser.

FIG. 2 shows that the change of thickness of an additional $Si_xN_y$ layer influences the power reflectance of the outcoupling mirror (FIG. 2(a)) and the cavity photon lifetime (FIG. 2(b)). A reduction of the cavity photon lifetime decreases the damping. This reduction results in a larger "over-shoot" (an increase of the maximum value of the modulation response), but not necessarily a larger bandwidth.

The small-signal modulation bandwidth of a laser is the frequency at which the magnitude of the output power, when driven by an electrical (sinusoidal) signal, is reduced to half the value at low frequencies. The change in the output power of the transmitted signal as a function of the frequency f is described by the following transmission function [7]:

$$H(f) = \left| A \cdot \frac{f_R^2}{\left(f_R^2 - f^2 + i\frac{\gamma}{2\pi}f\right)} \cdot \frac{1}{1 + i\frac{f}{f_P}} \right| \quad (1)$$

where $f_R$ and $\gamma$ are the relaxation resonance frequency and attenuation. The parameter A is an offset and $f_P$ is the 3 dB frequency of the VCSEL parasitics. The parameters in (1) are determined from the transmission function measured e.g. with a vector network analyzer.

Figure 3:
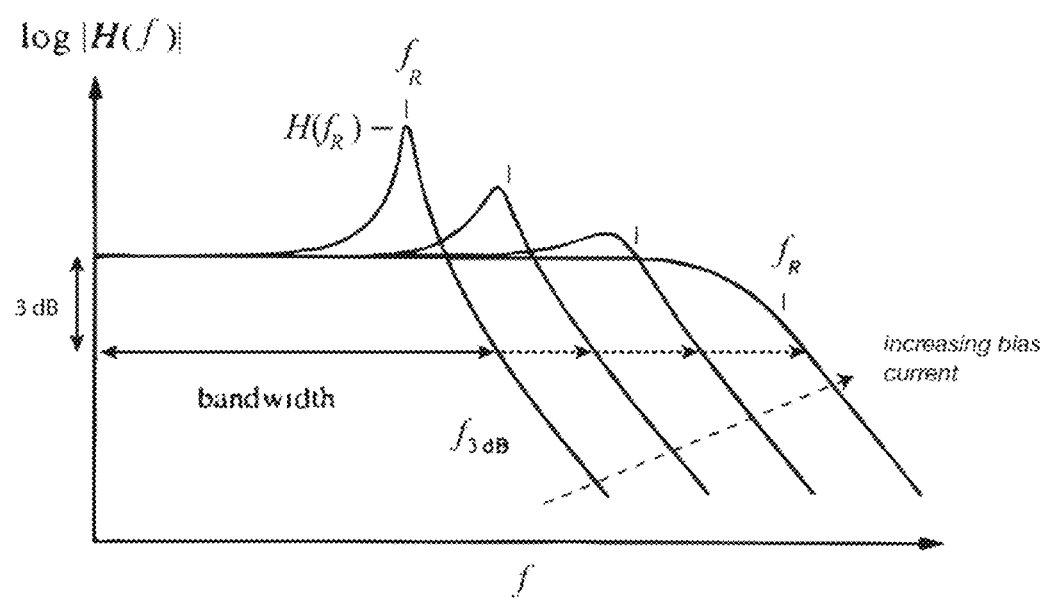
FIG. 3 shows theoretical small-signal modulation impulse responses of a VCSEL at different forward bias currents [8]. The relaxation resonance frequency $f_R$ is marked for all $H(f_R)$ functions.

FIG. 3 shows simulations of VCSEL impulse responses for increasing forward bias currents. The resonance frequencies $f_R$ are marked and can be easily estimated from the plotted pulse responses. The attenuation, on the other hand, can be obtained by means of fitting the measured data to the transmission function (1). The relaxation resonance frequency is an independent variable, whereas the attenuation is a function of $f_R$.

$H(f_R)$ is the transfer function value at the resonance frequency $f_R$. The −3 dB bandwidth $f_{3\,dB}$ is the frequency at which the magnitude of H(f) drops by a factor of 2 from its initial low-frequency value.

The small signal modulation response can be measured by using a vector network analyzer (VNA). A sinusoidal signal with very small amplitude (−25 dBm) is generated by the VNA, modulates the laser output and is transmitted from the laser across a fiber, demodulated by a photodiode and sent back to the VNA. The VNA describes this linear network by using the power based scattering parameters (S11 power reflection VNA port 1, S22 power reflection port 2, S12 power transmission from port 2 to port 1, S21 power transmission from port 1 to port 2). The small signal modulation response is the transmission through this network expressed as the scattering parameter S21, measured by the VNA. The small signal modulation response of the system has to be corrected for the response curve of the photodetector to get the small signal modulation response of only the laser (FIG. 3). $H(f_R)$ can be easily determined from the plotted curve.

Both A and the low-pass filter term of the parasite $f_P$ in Equ. (1) are set to 1 in the following analysis, since only the intrinsic transfer function needs to be considered here, leading to the following equation $$H(f) = \frac{f_R^2}{\left(f_R^2 \cdot f^2 + i\frac{\gamma}{2\pi}f\right)} \quad (2)$$

The transfer function $H(f)$ and thus the small-signal modulation bandwidth frequency is depending on $f_R$ and $\gamma$. The damping $\gamma$ is given by:

$$\gamma = K \cdot f_R^2 + \gamma_0 \quad (3)$$

which is thus depending on $f_R$. The term K is given by:

$$K = 4\pi^2 \left(\tau_p + \frac{\varepsilon \cdot \chi}{v_g \cdot \left(\frac{\partial g}{\partial N}\right)}\right) \quad (4)$$

and $$D = \frac{1}{2\pi}\sqrt{\frac{\eta_i \cdot \Gamma \cdot v_g}{q \cdot V_g} \cdot \frac{\left(\frac{\partial g}{\partial N}\right)}{\chi}} \quad (5)$$

in $$f_R = D\sqrt{I - I_{th}} \quad (6)$$

The damping $\gamma$ and the relaxation resonance frequency $f_R$ vary strongly with the differential gain ($\partial g/\partial N$), the group velocity $V_g$, and the charge carrier transport factor $\chi$. $f_R$ is additionally dependent on the optical confinement factor $\Gamma$ and the active volume $V_g$. The damping $\gamma$ depends on the gain compression factor $\in$ and, of course, on the cavity photon lifetime $\tau_p$. These are all basic laser properties, strongly related to the design of the active region. It is not possible to simply predict the optimum VCSEL transfer function $H(f)$, as it varies with the particular VCSEL optical transmission system. The damping parameter $\gamma$ is also unsuitable to serve as a VCSEL parameter to optimize.

Given the relaxation resonance frequency $f_R$, the bandwidth can be written as:

$$f_{3dB} = \frac{f_{3dB}}{f_R} \cdot f_R \quad (7)$$

To consider the relationship in (7) more closely, the transfer function can be limited to its intrinsic value:

$$H(f) = \sqrt{\frac{f_R^4}{\left((f_R^2 - f^2) + \frac{\gamma^2}{4\pi^2}f^2\right)}} \quad (8)$$

A value $H(f_R)$ can thus be assigned to the resonance frequency in an unambiguous manner. This value of $H(f_R)$ is found from the plot in FIG. 3. The damping at $f_R$ is:

$$\gamma = \frac{2\pi f_R}{H(f_R)} \quad (9)$$

The transfer function thus becomes:

$$H(f) = \sqrt{\frac{f_R^4}{\left((f_R^4 - f^2)^2 + \frac{f^2 f_R^2}{H(f_R)^2}\right)}} \quad (10)$$

The bandwidth $f_{3\,dB}$ is defined as:

$$H(f_{3\,dB}) = -3 \text{ dB} \quad (11)$$

Then the ratio of the bandwidth to the relaxation resonant frequency is:

$$\frac{f_{3dB}}{f_R} = \frac{\sqrt{2 + \sqrt{4 \cdot 10^{\frac{3}{10}} + \frac{1}{H(f_R)^4} - \frac{4}{H(f_R)^2}} - \frac{1}{H(f_R)^2}}}{\sqrt{2}} \quad (12)$$

Using $H(f_R)$, it is possible to describe the bandwidth (7) solely by the "form" of the transmission function, whereby the resonant frequency and the value of the function can be estimated at the location of the relaxation resonance frequency. The change of the output mirror reflectivity by adding a topmost dielectric layer to the VCSEL will directly impact the intrinsic bandwidth term $$\frac{f_{3dB}}{f_R}.$$

The term $$\frac{f_{3dB}}{f_R}$$

can now be changed in a limited range by changing the output coupling mirror reflectivity. This change in reflectivity converges to a maximum value of $$\frac{f_{3dB}}{f_R}$$

as $H(f_R)$ goes to infinity, given by:

$$\lim_{H(f_R) \to \infty} \frac{f_{3dB}}{f_R} = \sqrt{1 + 10^{\frac{3}{20}}} \approx 1.55 \approx \sqrt{1 + \sqrt{2}} \quad (13)$$

Figure 4:
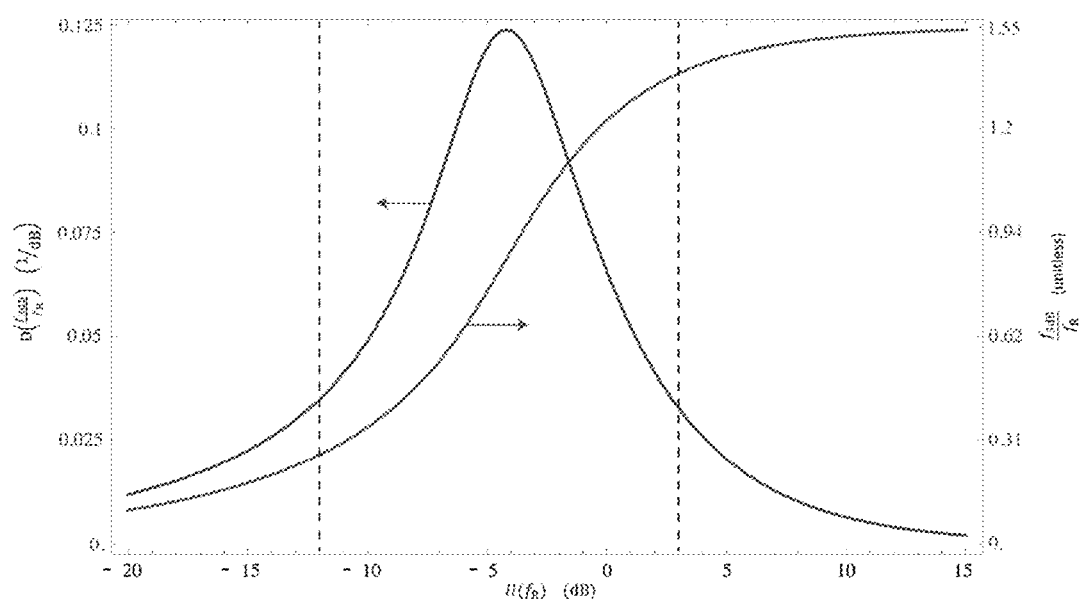
FIG. 4 shows the ratio $$\frac{f_{3dB}}{f_R}$$

FIG. 4 shows a plot of equation (12) A change in the mirror reflectivity and thus a change in H(f$_R$) causes a large change of $$\frac{f_{3dB}}{f_R}$$

in the H(f$_R$) interval between −12 dB to 3 dB indicated by the vertical dashed lines. For real lasers, values of H(f$_R$)>−2 are typically observed. In the range H(f$_R$)<3 the value of $$\frac{f_{3dB}}{f_R}$$

increases. For H(f$_R$)>3 it a bandwidth increase (by increasing $$\frac{f_{3dB}}{f_R})$$

is essentially compensated by a bandwidth reduction (by reducing f$_R$). The threshold current can be arbitrarily increased and the corresponding relaxation resonance frequency according to (5) will become arbitrarily small.

The general optimization parameter is H(f$_R$). This parameter is nominally independent of the laser type, shape, and size. The optimal operating point is just beyond the 3 dB cut-off frequency, which can be found by varying the mirror reflectivity.

Note: Two VCSELs of the same epitaxial and geometrical structure but having different oxide aperture diameters, will require different coupling mirror reflectivity for optimum operation, but H(f$_R$) should be about −3 dB for each. If a laser is to be operated at different operating points, an optimum mirror reflectivity exists for each operating point. However, H(f$_R$) is close to −3 dB (between −2.5 dB and −3.2 dB) at all operating points.

Technology for Optimizing VCSELs

Antypical embodiment of a method for fabricating a VCSEL will be explained below in further detail. The starting point may be an arbitrary, fully processed VCSEL as shown in FIG. 5. FIG. 5 shows a cross-section through the top-mesa of a fully processed vertical cavity surface emitting laser, VCSEL, 10. The VCSEL 10 comprises a first (lower or buried) reflector 20 and a second (upper) reflector 30. The second reflector 20 comprises a layer stack 31 of semiconductor layers 32. An active region 40, that is capable of generating radiation in response to an electrical current, is arranged between the first and second reflectors. The first and second reflectors 20 and 30 are preferably Distributed Bragg Reflectors (DBRs). Planarization material 50 (e. g. Benzocyclobutene (BCB)) is deposited to level or flatten the laser's surface. The VCSEL 10 further comprises upper metal contacts 60 and a lower metal contact 70. The lower metal contact 70 may be separated from the first reflector 20 by a substrate which is not depicted in FIG. 5.

FIG. 6 shows the VCSEL 10 after covering the second reflector 30, parts of the upper contacts 60 and the planarization material 50 with an additional layer 80. The additional layer 80 is deposited on top of the layer stack 31 at the light output side of the VCSEL 10. The additional layer 80 forms an output interface 100 where the radiation R leaves the VCSEL 10.

The refractive index of the additional layer 80 is smaller, equal to or larger than the smallest refractive index of the refractive indices of the layers 32 in the layer stack 31. The transmission of the additional layer 80 at the emission wavelength of the laser is preferably larger than 99%.

In order to characterize the VCSEL 10 and in order to determine whether the thickness of the additional layer 70 lies in a preferred range with respect to the laser's performance, the following steps can be carried out:

An operating point (the forward direct-current bias point at which the laser is to be optimized) is set by applying a corresponding electrical DC voltage between the upper metal contact 60 and the lower metal contact 70. Further, a small sinusoidal AC voltage is applied to the contacts.

The frequency of the sinusoidal signal (AC voltage) is swept in a given frequency range, and the small signal response of the radiation R that leaves the laser 10 at the output interface 100 is measured. The measured small signal response is fitted to the following transmission function H(f):

$$H(f) = A \cdot \frac{f_R^2}{\left(f_R^2 - f^2 + i\frac{\gamma}{2\pi}f\right)} \cdot \frac{1}{1 + i\frac{f}{f_P}}$$

and the parameters f$_R$, γ, A and f$_P$, are determined, wherein f$_R$ describes the relaxation resonance frequency, γ the damping parameter, A an offset and f$_P$ the 3 dB frequency of the laser's parasitics.

Then, the design parameter H(f$_R$) is calculated by calculating the value of the transmission function H(f) at the relaxation resonance frequency f$_R$ based on the parameters that were determined as explained above.

If the design parameter H(f$_R$) is in the range between −2.5 and −3.2 dB, the thickness of the additional layer 70 is deemed optimal.

If the design parameter H(f$_R$) is outside the range between −2.5 and −3.2 dB, the thickness of the additional layer 70 is deemed suboptimal and will be increased by depositing more layer material. Then, the above steps can be repeated again and again until the design parameter H(f$_R$) is inside the range between −2.5 and −3.2 dB.

Since the mirror reflectivity is periodic in optical thicknesses of λ/2, it is possible to find a suitable coating thickness to decrease or increase the reflectivity. If the reflectivity has to be increased beyond this interval, entire DBR mirror pairs can be deposited. A required coating thickness is produced by repeated deposition followed by subsequent small-signal measurements, such that the top mirror has the desired optical loss. Than H(f$_R$) corresponds to about −3 dB and an optimal H(f$_R$) shape is obtained.

This process of adjusting the cavity photon lifetime is nondestructive and does not rely upon a complex etching process as described above with reference to FIG. 1. The coating process is reliable, fast, and can be performed on a volume production basis.

EXPERIMENTS—EXAMPLES

FIG. 7 shows the simulated ratio of bandwidth and relaxation resonance frequency as a function of log H(f$_R$) for one VCSEL with two different mirror reflectivities (round/ square symbols: larger/smaller reflectivity, respectively) for increasing current. The dashed and full straight lines connecting the symbols present the variation of f$_{3\,dB}$/f$_R$ for decreasing current (left to right) for smaller (dashed) and a larger (full) values of the damping parameter γ, respectively. Decreasing damping corresponds to a shift along the faintly dashed curves. The two vertical lines display the window for maximum bandwidth.

In summary, optimizing the seemingly contradictory properties of maximum bandwidth and energy efficiency can be achieved by simultaneously optimizing the interplay of all laser diode parameters, without any exception. The method presented above optimizes for the first time the energy-efficiency of vertical-cavity surface-emitting lasers (VCSELs), while also achieving large bandwidths. Embodiments of the method allows:

- A small-signal modulation bandwidth increase of more than 10%.
- Energy reduction for data transmission at a given bit rate of up to 50%.
- An increase in the laser diode output power by more than 100%.
- The embodiments are based on the discovery of a laser diode optimization parameter, that leads to the definition of a general performance optimization procedure. This procedure eliminates the need to perform time-consuming laser testing and analysis of similar batches of the laser diodes.
- The optimization process is destruction-free, requiring no material removal, such that the lasers are ready to be used in their as-processed, original state.
- The optimization technology is fast, requires minimal handling, and is low cost.
- The optimization by the deposition of a thin surface layer proceeds with nanometer-scale precision, and can be easily controlled by ellipsometry.

REFERENCES

[1] P. Wolf, P. Moser, G. Larisch, and D. H. Bimberg, "High-Speed and Temperature-Stable oxide-confined 980-nm VCSELs for Optical Interconnects," IEEE Journal of Selected Topics in Quantum Electronics, vol. 19, pp. 1-7, 2013.
[2] A. Mutig, J. A. Lott, S. A. Blokhin, P. Moser, P. Wolf, W. Hofmann, et al., "Highly temperature-stable modulation characteristics of multioxide-aperture high-speed 980 nm vertical cavity surface emitting lasers," Applied Physics Letters, vol. 97, pp. 151101-1-3, 2010.
[3] D. Ellafi, V. Iakovlev, A. Sirbu, G. Suruceanu, Z. Mickovic, A. Caliman, et al., "Control of cavity lifetime of 1.5-□m wafer-fused VCSELs by digital mirror trimming," Optics Express, vol. 22, p. 32180, 2014.
[4] P. Westbergh, J. S. Gustavsson, B. Kogel, A. Haglund, and A. Larsson, "Impact of Photon Lifetime on High-Speed VCSEL Performance," IEEE Journal of Selected Topics in Quantum Electronics, vol. 17, pp. 1603-1613, November-December 2011.
[5] M. Köhler and A. Wiegand, Etching in microsystem technology. Weinheim [etc.]: Wiley-VCH, 1999.
[6] C. A. B. G. C. DeSalvo, J. L. Ebel, D. C. Look, J. P. Barrette, C. L. A. Cerny, R. W. Dettmer, J. K. Gillespie, C. K. Havasy, T. J. Jenkins, K. Nakano, C. I. Pettiford, T. K. Quach, J. S. Sewell and G. D. Via, "Wet Chemical Digital Etching of GaAs at Room Temperature," J. Electrochem. Soc., vol. 143, 1996.
[7] A. Larsson, "Advances in VCSELs for Communication and Sensing," IEEE Journal of Selected Topics in Quantum Electronics, vol. 17, pp. 1552-1567, 2011.
[8] L. A. Coldren and S. W. Corzine, Diode lasers and photonic integrated circuits. New York, N.Y., USA: Wiley, 1995.
[9] G. Larisch, P. Moser, J. A. Lott, and D. Bimberg, "Impact of Photon Lifetime on the Temperature Stability of 50 Gb/s 980 nm VCSELs," IEEE Photonics Technology Letters, vol. 28, pp. 2327-2330, 2016.
[10] G. Larisch, P. Moser, J. A. Lott, and D. Bimberg, "Correlation of photon lifetime and maximum bit rate for 55 Gbit/s energy-efficient 980 nm VCSELs," in 2016 IEEE Optical Interconnects Conference (OI), 2016, pp. 16-17.

The invention claimed is:

1. A vertical cavity surface emitting laser comprising:
a first reflector;
a second reflector comprising a layer stack of semiconductor layers or isolating layers;
an active region arranged between the first and second reflectors; and
an additional layer on top of the layer stack at a light output side, the additional layer forming an output interface of the laser, wherein
the refractive index of the additional layer is smaller than a smallest refractive index of the refractive indices of the layer stack; and
a thickness of the additional layer is chosen such that a design parameter $H(f_r)$ is in the range between 2.5 and 3.2 dB, the design parameter $H(f_r)$ being determined by:
applying a voltage that generates a predetermined bias current and a small sinusoidal current signal through the laser;
sweeping a frequency of the sinusoidal signal in a given frequency range;
measuring a small signal response of the radiation that leaves the laser at the output interface;
fitting the measured small signal response to the following transmission function H(f):

$$H(f) = A \cdot \frac{f_R^2}{\left(f_R^2 - f^2 + i\frac{\gamma}{2\pi}f\right)} \cdot \frac{1}{1 + i\frac{f}{f_P}}$$

determining parameters $f_R$, γ, A and $f_P$, wherein $f_R$ describes a relaxation resonance frequency, γ the damping parameter, A an offset, and $f_P$ the 3 dB frequency of the laser's parasitics; and
calculating the design parameter $H(f_R)$ by calculating the value of the transmission function H(f) at the relaxation resonance frequency $f_R$ based on the parameters that were determined as explained above.

2. The laser according to claim 1, wherein the refractive index of the additional layer is at least 25% smaller than the smallest refractive index of the refractive indices of the layer stack.

3. The laser according to claim 1, wherein an electrical contact is arranged on at least one section of a highly doped layer of the layer stack, the doping concentration of the highly doped layer exceeding $5*10^{18}$ cm$^3$.

4. The laser according to claim 1, wherein the additional layer is an isolating layer.

5. The laser according to claim 1, wherein the additional layer is a silicon nitride or a silicon oxide layer or a titanium oxide layer.

6. The laser according to claim 1, wherein the additional layer is a conductive layer.

7. The laser according to claim 1, wherein the additional layer is an indium tin oxide or a GaAs layer.

8. The laser according to claim 1, wherein the thickness of the additional layer is between $(0.02*\lambda$ and $0.24*\lambda)+n*0.5*\lambda$ or between $(0.26*\lambda$ and $0.48*\lambda)+n*0.5*\lambda$ where n is an integer.

9. A vertical cavity surface emitting laser comprising:
a first reflector;
a second reflector comprising a layer stack of semiconductor layers or isolating layers;
an active region arranged between the first and second reflectors; and
an additional layer on top of the layer stack at a light output side, the additional layer forming an output interface of the laser; and
an electrical contact is arranged on at least one section of a highly doped layer of the layer stack, the doping concentration of the highly doped layer exceeding $5*10^{18}$ cm$^{-3}$, the additional layer partly covering the electrical contact, wherein
the refractive index of the additional layer is smaller than a smallest refractive index of the refractive indices of said layer stack; and
a thickness of the additional layer is chosen such that a design parameter $H(f_r)$ is in the range between 2.5 and 3.2 dB, the design parameter $H(f_r)$ being determined by:
applying a voltage that generates a predetermined bias current and a small sinusoidal current signal through the laser;
sweeping a frequency of the sinusoidal signal in a given frequency range;
measuring a small signal response of the radiation that leaves the laser at the output interface;
fitting the measured small signal response to the following transmission function $H(f)$:

$$H(f) = A \cdot \frac{f_R^2}{\left(f_R^2 - f^2 + i\frac{\gamma}{2\pi}f\right)} \cdot \frac{1}{1+i\frac{f}{f_P}}$$

determining the parameters $f_R$, $\gamma$, A and $f_P$, wherein $f_R$ describes a relaxation resonance frequency, $\gamma$ the damping parameter, A an offset and $f_P$ the 3 dB frequency of the laser's parasitics; and
calculating the design parameter $H(f_R)$ by calculating the value of the transmission function $H(f)$ at the relaxation resonance frequency $f_R$ based on the parameters that were determined as explained above.

10. A method of fabricating a vertical cavity surface emitting laser, the method comprising the steps of:
fabricating a first reflector;
fabricating an active region on top of the first reflector;
fabricating a second reflector on top of the active region, the second reflector comprising a layer stack of semiconductor layers or isolating layers; and
depositing an additional layer on top of the layer stack, wherein
the refractive index of the additional layer is smaller than a smallest refractive index of the refractive indices of said layer stack; and
the step of depositing the additional layer is completed when a design parameter $H(f_R)$ is in the range between 2.5 and 3.2 dB, the design parameter $H(f_R)$ being determined by:
applying a voltage that generates a predetermined bias current and a small sinusoidal current signal through the laser;
sweeping a frequency of the sinusoidal signal in a given frequency range;
measuring a small signal response of the radiation that leaves the laser at the output interface;
fitting the measured small signal response to the following transmission function $H(f)$:

$$H(f) = A \cdot \frac{f_R^2}{\left(f_R^2 - f^2 + i\frac{\gamma}{2\pi}f\right)} \cdot \frac{1}{1+i\frac{f}{f_P}}$$

determining the parameters $f_R$, $\gamma$, A and $f_P$, wherein $f_R$ describes a relaxation resonance frequency, $\gamma$ the damping parameter, A an offset and $f_P$ the 3 dB frequency of the laser's parasitics; and
calculating the design parameter $H(f_R)$ by calculating the value of the transmission function $H(f)$ at the relaxation resonance frequency $f_R$ based on the parameters that were determined in the previous step.

11. The method of claim 10, wherein
the laser is fabricated by depositing the additional layer with a suitable layer thickness that provides a design parameter $H(f_R)$ in the range between 2.5 and 3.2 dB; and
the suitable layer thickness has been determined beforehand based on a plurality of lasers with varying thicknesses of the additional layer and therefore varying design parameters $H(f_R)$.

12. The method of claim 11, wherein
the deposition of the additional layer comprises one or more deposition steps, each deposition step comprising:
(a) depositing a thin layer of isolating or conducting material;
(b) applying a voltage that generates a predetermined bias current and a small sinusoidal current signal through the laser structure;
(c) sweeping the frequency of the sinusoidal signal in a given frequency range;
(d) measuring the small signal response of the radiation that leaves the laser structure at the output interface;
(e) fitting the measured small signal response to the following transmission function $H(f)$:

$$H(f) = A \cdot \frac{f_R^2}{\left(f_R^2 - f^2 + i\frac{\gamma}{2\pi}f\right)} \cdot \frac{1}{1+i\frac{f}{f_P}}$$

and determining the parameters $f_R$, $\gamma$, A and $f_P$, wherein $f_R$ describes a relaxation resonance frequency, $\gamma$ the damping parameter, A an offset and $f_P$ the 3 dB frequency of the laser's parasitics;
(f) calculating the design parameter $H(f_R)$ by calculating the value of the transmission function $H(f)$ at the relaxation resonance frequency $f_R$ based on the parameters determined in step (e);

(g) if the design parameter $H(f_R)$ is in the range between 2.5 and 3.2 dB, finishing the deposition of layer material; and (h) if the design parameter $H(f_R)$ is outside said range between 2.5 and 3.2 dB, repeating above steps (a)-(h).

13. The method of claim 10, further comprising the steps of:

depositing an electric contact layer on a section of a highly doped layer of the second reflector, the doping concentration of the highly doped layer exceeding $5*10^{18}$ cm$^{-3}$; and depositing an isolating material to planarize the wafer surface.

14. The method of claim 10, wherein a contact layer is deposited on a section of a highly doped layer of said layer stack, the doping concentration of said highly doped layer exceeding $5*10^{18}$ cm$^{-3}$;

the additional layer is deposited after the deposition of the contact layer; and the voltage that generates the predetermined bias current and the small sinusoidal current signal is applied to the contact layer after the deposition of the additional layer.

15. The method of claim 12, wherein a contact layer is deposited on a section of a highly doped layer of said layer stack, the doping concentration of said highly doped layer exceeding $5*10^{18}$ cm$^{-3}$;

the additional layer is deposited after the deposition of the contact layer; and the voltage that generates the predetermined bias current and the small sinusoidal current signal is applied to the contact layer after the deposition of the additional layer.

16. The method of claim 10, wherein the additional layer is an isolating layer.

17. The method of claim 10, wherein the additional layer is a silicon nitride layer, a silicon oxide layer, a titanium oxide layer, or an indium tin oxide layer.

18. A method of fabricating a vertical cavity surface emitting laser, the method comprising the steps of:

fabricating a first reflector;

fabricating an active region on top of the first reflector;

fabricating a second reflector on top of the active region, the second reflector comprising a layer stack of semiconductor layers or isolating layers;

depositing an electric contact layer on a section of a highly doped layer of the second reflector, the doping concentration of the highly doped layer exceeding $5*10^{18}$ cm$^{-3}$;

depositing an additional layer on top of the layer stack, the additional layer being deposited after the deposition of the electric contact layer; and depositing an isolating material to planarize the wafer surface, wherein the refractive index of the additional layer is smaller than a smallest refractive index of the refractive indices of said layer stack; and the step of depositing the additional layer is completed when a design parameter $H(f_R)$ is in the range between 2.5 and 3.2 dB, the design parameter $H(f_R)$ being determined by:

applying a voltage that generates a predetermined bias current and a small sinusoidal current signal through the laser, sweeping the frequency of the sinusoidal signal in a given frequency range;

measuring the small signal response of the radiation that leaves the laser at the output interface;

fitting the measured small signal response to the following transmission function $H(f)$:

$$H(f) = A \cdot \frac{f_R^2}{\left(f_R^2 - f^2 + i\frac{\gamma}{2\pi}f\right)} \cdot \frac{1}{1 + i\frac{f}{f_P}}$$

determining the parameters $f_R$, $\gamma$, $A$ and $f_P$, wherein $f_R$ describes a relaxation resonance frequency, $\gamma$ the damping parameter, $A$ an offset and $f_P$ the 3 dB frequency of the laser's parasitics; and calculating the design parameter $H(f_R)$ by calculating the value of the transmission function $H(f)$ at the relaxation resonance frequency $f_R$ based on the determined parameters.

* * * * *